April 14, 1959 W. F. SANDS 2,882,392

RECEIVER TUNED BY INDUCTORS WITH TRACKING BY INITIAL POSITIONMENT OF COILS ON CORES

Original Filed May 31, 1950

INVENTOR
WILLIAM F. SANDS
BY H. C. Weston
ATTORNEY

United States Patent Office 2,882,392

Patented Apr. 14, 1959

2,882,392

RECEIVER TUNED BY INDUCTORS WITH TRACKING BY INITIAL POSITIONMENT OF COILS ON CORES

William F. Sands, Haddonfield, N.J., assignor to Radio Corporation of America, a corporation of Delaware Continuation of application Serial No. 165,319, May 31, 1950. This application March 9, 1955, Serial No. 493,192

3 Claims. (Cl. 250—20)

This invention relates to variable tuning systems for radio signal selecting circuits and the like. More particularly the invention relates to variable control means for changing tuning ratios in variably tuned signal selecting circuits.

This application is a continuation of my copending application entitled, "Variable Inductance Circuits," filed on May 31, 1950, Ser. No. 165,319, and assigned to the assignee of the present application, now abandoned.

In radio receivers, variable tuning systems are presently required to provide large inductance variation ratios to tune over the entire broadcast band. Various schemes have been used to increase the tuning range or inductance variation ratio of variable tuning devices and systems. This is for the reason that the tuning range in the oscillator circuit of a usual superheterodyne receiver is different from that of other tuned circuits therein. It is therefore essential to provide two or more signal circuits tunable through predetermined frequency ranges in such a manner as to provide good tracking and substantially a constant frequency difference between the two circuits. It is accordingly an object of this invention to provide an improved tuning system for radio signal circuits and the like, wherein the tuning ratio or tuning characteristic may variably be adjusted.

There are several known methods and means for effecting tracking in the tuning characteristics of two or more circuits employing variable tuning. These are in some cases impractical because of cost, manufacturing or servicing difficulties or because of extra components required. It is therefore another object of the invention to provide a simplified and improved tuning system for a superheterodyne receiver which permits a desired tracking relation between two tunable circuits and adjustment of the tuning characteristic of one or both circuits.

Permeability tuning circuits in particular are extensively used and employ different forms of tracking devices. Among these devices are those with uniquely shaped cores or coils. These cores and coils, however, are not only difficult to manufacture at low cost, but are generally suited only for use in one particular type of circuit. It is desirable to provide means adaptable for use in different types of circuits without manufacturing changes. Therefore there is a necessity for a single type of device for tracking adjustment which may be universally used. In addition, the manufacturing cost of such a device is preferably small.

It is therefore another object of the invention, to provide an improved means for changing the inductance ratio in tunable signal circuits which is particularly adapted for use with permeability tuned inductors and coil elements.

It is a further object of the invention, to provide means for modifying the tuning characteristics of permeability tuned signal circuits or the like in a simplified manner without involving manufacturing difficulties or the provision of extra circuit components.

It is a still further object of the invention, to provide improved variable tuning means which is adjustable for accurate tracking between a plurality of tuned circuits and which may be used with different types of circuits and operating conditions in tunable signal conveying systems.

In accordance with the invention there is provided in one specific embodiment, an inductive winding associated with a saturable magnetic core. The magnetic core is substantially longer than the winding and is constructed to extend in both directions from the winding. In tuning the winding, saturation means such as a permanent magnet is provided for variably changing the permeability of the core. Thus, further in accordance with the invention, the position of the winding upon the long saturable core determines the permeability tuning range of the device. Therefore as the winding is asymmetrically mounted along the core, the tuning characteristics of the device are modified accordingly.

The construction and mode of operation of the invention, together with further objects and advantages, will become more apparent when considered in connection with the accompanying drawing.

Figures 1, 2, 3, 4, 5, 6, 7, 8:
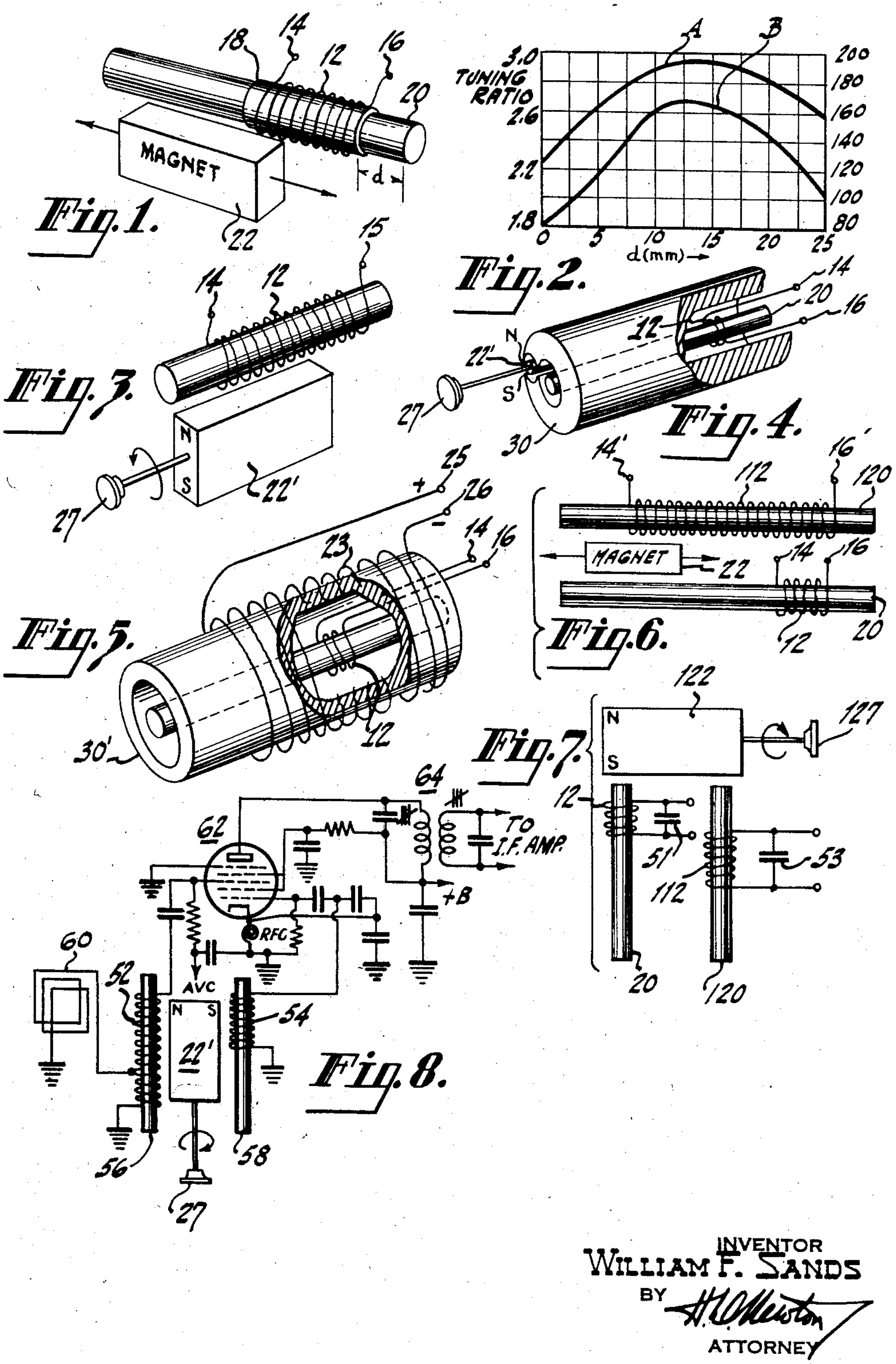
Figure 1 is a perspective view of a variable permeability tuning device for use in a tuning system in accordance with the invention, and wherein a permanent magnet adjustment means is employed.
Figure 2 is a graph showing the changes in the tuning ratio and inductance ratio which result from the use of a device of the type shown in Figure 1, in a tuning system in accordance with the invention.
Figures 3 and 4 are perspective views of modifications of a tuning device of Figure 1 with rotary adjustment means and also adapted for use in a tuning system in accordance with the invention.
Figure 5 is a perspective view of a further tuning device in accordance with the invention and wherein a saturation winding adjustment means is provided.
Figures 6 and 7 are side views of still further embodiments of the invention in tuning means which illustrate certain advantages of the invention for use with variably tuned tracking circuits.
Figure 8 is a schematic circuit diagram of a radio signal receiving system embodying the invention.

Referring to the drawing wherein like reference characters represent like circuit components in the respective views, and particularly to Figure 1, there is shown a tuning inductance or winding 12 having terminals 14 and 16. An external tunable circuit, as hereinafter described in connection with Figure 8, may be connected to the terminals 14 and 16. The inductance 12 is wound upon a coil form 18 through which is inserted a longitudinally disposed saturable magnetic core or element 20, such as is well known in the art. In this specification and the appended claims the term "core" or "core element" is used generically to indicate any tuning modification element in the field of the winding unless otherwise qualified.

The saturable core 20 is substantially longer than the inductive winding 12. It therefore extends from both ends of the coil form 18. Accordingly, the coil form 18 may be cemented at a fixed position of asymmetry with respect to the core. Other means may be provided for locating the coil form on the core, if desired. The winding may be permeably tuned by means of a suitable saturating flux source such as a permanent magnet 22. The permanent magnet, as shown in this embodiment, is longitudinally moved along an axis parallel to that of the saturable core, and closely adjacent to the coil. It is also within the concept of the invention to provide other tuning means such as a variable or fixed capacitor means connected in circuit with the winding 12 as will hereinafter appear.

As will be clearly shown upon a consideration of the graph in Figure 2, it has been found that the longitudinal spacing of the winding along a portion of a suitable core provides certain advantageous effects. For example, the curve A of the graph shows that a variable tuning ratio may be obtained. The tuning ratio may be defined as used in this application, as the ratio of maximum to minimum tuned frequencies of a circuit tuned by a variable inductance. Likewise, curve B shows that a variable winding inductance may be obtained. The tuning ratio and the winding inductance are dependent upon the distance (*d*) of the winding 12 from the end of the saturable core 20. The particular core used in obtaining the described curve was a saturable ferrite rod 41.5 millimeters long. The accompanying winding was a single layer helical closely wound coil 15 millimeters long. The abscissa values on the graph represent the distance in millimeters from the end of the coil 12 to the corresponding end of the saturable core 20.

Ordinate values on the left represent the tuning ratio as obtained in a particular circuit when the coil 12 was provided with a shunted capacitor forming a parallel resonant circuit therewith. Ordinate values on the right represent the inductance of the coil and the core in microhenries with the magnet moved to infinity. It is therefore seen that there is provided in accordance with the means described a simplified arrangement which may be used to provide a compressed or expanded tuning ratio. It is obvious from a consideration of the teaching of this invention and the constructional details thereof that the expansion or compression of the tuning ratio is provided without any additional circuit components or any difficult constructional details.

In Figures 3 and 4 embodiments are illustrated which operate in a somewhat similar manner. In these embodiments, tuning of the inductive winding 12 is accomplished by means of a rotatable permanent magnet 22'. The magnet 22' in this case may easily be controlled from the front panel of the receiver or the like by means of a directly connected control knob 27. In Figure 4, there is provided concentric with the saturable core 20 a cylindrical ring or yoke 30 of magnetic material. The magnet 22' is rotatable within a gap extending through the yoke in a direction parallel with the axis of the saturable core 20. In this embodiment the saturation efficiency of the permanent magnet 22' is increased, by enclosing the entire magnetic yoke about the saturable core.

In Figure 5 a similar tuning arrangement is shown having a complete cylindrical magnetic yoke 30. In this embodiment, however, the saturation flux is provided by means of a saturating winding 23 which may be variably energized in any suitable manner through terminals 25 and 26. The saturating winding 23 rather than a permanent magnet therefore provides the saturating field. Modification of the tuning ratio is accomplished in each embodiment by moving the tunable winding 12 along the saturable core 20.

The hereinbefore described tuning arrangement is shown in Figures 6 and 7 in combination with a somewhat similar tuning device to illustrate certain advantages of the invention. Two magnetic cores 20 and 120 of saturable material or the like are provided in closely spaced parallel relationship. A permanent magnet 22, as shown in Figure 6, is located in the proximity to both cores and is movable axially with respect thereto. Tunable windings 12 and 112, which may be connected in two separate electrical circuits, are arranged concentrically about the saturable cores. Terminals 14 and 16 are provided for connection of the windings in any suitable electronic circuit. One of the windings 12 is preferably disposed along only a portion of its corresponding core 20. As hereinbefore described, this winding then may be moved into a position of asymmetry with respect to the core in order to modify tuning characteristics of the winding. It is therefore easily recognized that the described combination may be used to modify the tuning characteristics in such a manner as to attain tracking between two electrical circuits which are tuned in unison.

Other embodiments of the tuning means may be used as shown in Figure 7. A saturating flux is therein provided by means of a rotatable permanent magnet 122' located closely adjacent one end of each of the parallel saturable cores. Rotation of the magnet 122' may then be effected directly by the shaft and tuning knob 127 connected thereto. It is recognized that the tuning means is not necessarily restricted to a permanent magnet or to saturable permeability tuning. Although permeability tuning is preferred in some cases, certain advantages may be obtained, for example, by tuning the coils with a shunted variable capacitor or the like. Capacitors 51 and 53 in shunt with the respective windings 12 and 112 are used to provide a parallel resonant tuning circuit. These may be selected of proper size to aid in the selection of the required tuning ranges. Trimmer capacitors may in addition be used if necessary for further tuning or tracking adjustments.

A tracking arrangement such as described is of particular advantage when used in a superheterodyne receiver as shown by the schematic diagram of Figure 8. A pair of tunable circuits comprising windings 52 and 54 is provided, and saturable tuning cores 56 and 58 are inserted within the magnetic fields of the respective windings. A variable saturating flux is supplied by means of a rotating permanent magnet 22' of the type described. The first winding 52 is connected as a tunable input transformer connecting a signal source such as a loop antenna 60, or the like, to the receiver input circuit. Signal energy is thereby coupled to an amplifier and mixer stage 62 by means of this tunable input circuit.

The second winding 54 is used as the tuning means in an oscillator circuit whose output energy is also applied to the mixer stage 62. Output energy at the intermediate frequency is taken from the mixer stage 62 and coupled to an intermediate frequency output transformer 64. Any suitable utilization device may be connected to the secondary of this transformer. As such receiver circuits and their operational characteristics are well known in the art, a general description will suffice in describing the advantages of the present invention in combination therewith.

In a superheterodyne circuit of this type it is generally desirable to tune the oscillator frequency to a frequency substantially different from that of the signal energy at the input of the receiver. Therefore, when uni-control tuning means is employed it is difficult to provide tracking between the tuned circuits operating over different frequency ranges, since the inductance of coil 54 of the oscillator circuit is then different from that of coil 52 of the signal input circuit. However, the tuning ratio or the inductance of one circuit may be changed in accordance with the invention by locating the circuit coil asymmetrically with respect to its tuning core. There is therefore provided simplified means for attaining the proper tracking relationship between two tuned circuits without the provision of any extra circuit components. The inductance winding 54 of the oscillator circuit, for example, is merely adjusted along the axis of the core 58 to change the winding inductance and the tuning ratio to a desired value. It is therefore not necessary to provide a winding or a core which is specifically designed for the particular circuit. Standard windings of proper inductance value may be used and easily adjusted on the core after incorporation into a receiver circuit to obtain proper tracking.

In accordance with the invention, there may be provided a simplified means for modifying the tuning characteristics of a variably tuned circuit. Furthermore, it will be seen that modification of the tuning characteristic of a signal conveying system as taught by the invention is accomplished in a tunable circuit having tuning means as described, by asymmetrically locating an inductive winding with respect to the center of a longitudinally extended core element. This feature, in combination with the hereinbefore described features of the various embodiments, provides improved function adapted for use in a variety of tunable signal responsive systems.

What is claimed is:

1. A superheterodyne radio receiver system comprising in combination, signal amplifier means having a tunable inductive winding, oscillator means having a second tunable inductive winding, a pair of saturable magnetic cores for said windings, said windings being fixedly mounted on their respective cores, the core for one of said windings having a length greater than that of said winding with the winding positioned intermediate between the ends of said core, signal mixer means coupled to said amplifier and oscillator means to produce a beat frequency signal, beat frequency signal utilization means coupled to said signal mixer means to receive the signal output therefrom, and variable saturation means coupled to said cores for varying the tuning of said windings simultaneously, said one winding being longitudinally positioned asymmetrically with respect to its core and differently than said second winding to establish a predetermined tracking relation in the tuning of said amplifier and oscillator means by said windings.

2. In a superheterodyne radio receiver, a tuning system comprising in combination, signal selection means having a first tunable circuit comprising a first inductive tuning winding, oscillator means having a second tunable circuit comprising a second inductive tuning winding, a pair of saturable cores for said windings, said windings being fixedly mounted with respect to their respective cores, one of said cores having a length greater than that of the winding thereon, signal mixer means connected to said signal selection and oscillator means to produce a beat frequency signal, output signal utilization means connected to said mixer means, and means for varying the tuning of said circuits simultaneously, one winding being longitudinally positioned between the ends of its core asymmetrically thereof and differently than the other of said windings to provide a predetermined tracking relation in the tuning of said signal selection means and oscillator means within the tuning range of the system.

3. In radio apparatus including a first signal circuit tunable over a range of frequencies, a second signal circuit tunable over a second and different range of frequencies, means for tuning said circuits simultaneously through said frequency ranges with a predetermined tracking relation including an inductive winding forming part of each tunable circuit, and a pair of permeable cores for said windings, said windings being fixedly mounted with respect to their respective cores, and one of said cores having a length greater than that of the related winding and the winding being prepositioned on said core between its ends asymmetrically thereof and differently than the other of said windings to establish said tracking relation between the two tunable circuits.

References Cited in the file of this patent

UNITED STATES PATENTS

| | | |
|---|---|---|
| 2,159,754 | Wohlforth | May 23, 1939 |
| 2,190,048 | Sinninger | Feb. 13, 1940 |
| 2,190,082 | Polydoroff | Feb. 13, 1940 |
| 2,248,242 | Landon | July 8, 1941 |
| 2,370,714 | Carlson | Mar. 6, 1945 |
| 2,389,986 | Koch | Nov. 27, 1945 |
| 2,486,152 | Gusdorf | Oct. 25, 1949 |
| 2,503,155 | Harvey et al. | Apr. 4, 1950 |
| 2,581,202 | Post | Jan. 1, 1952 |
| 2,641,704 | Stott | June 9, 1953 |

FOREIGN PATENTS

| | | |
|---|---|---|
| 840,140 | France | Jan. 11, 1939 |